(12) United States Patent
Jung et al.

(10) Patent No.: US 8,431,485 B2
(45) Date of Patent: Apr. 30, 2013

(54) MANUFACTURING METHOD FOR A BURIED CIRCUIT STRUCTURE

(75) Inventors: Le-Tien Jung, New Taipei (TW); Tai-Sheng Feng, Hsinchu (TW)

(73) Assignee: Taiwan Memory Company, Hsinchu (TW)

( * ) Notice: Subject to any disclaimer, the term of this patent is extended or adjusted under 35 U.S.C. 154(b) by 0 days.

(21) Appl. No.: 13/441,927

(22) Filed: Apr. 9, 2012

(65) Prior Publication Data

US 2012/0196436 A1    Aug. 2, 2012

Related U.S. Application Data

(63) Continuation of application No. 12/980,349, filed on Dec. 29, 2010, now Pat. No. 8,183,146.

(30) Foreign Application Priority Data

Jul. 14, 2010    (TW) ............................... 99123145 A

(51) Int. Cl.
*H01L 21/4763*    (2006.01)
*H01L 21/44*    (2006.01)
*H01L 21/302*    (2006.01)

(52) U.S. Cl.
USPC ........... 438/666; 438/669; 438/672; 438/685; 438/742

(58) Field of Classification Search ................... 438/666, 438/672, 669, 685, 742; 257/E21.537
See application file for complete search history.

(56) References Cited

U.S. PATENT DOCUMENTS

| | | | |
|---|---|---|---|
| 4,961,822 A | 10/1990 | Liao | |
| 5,219,789 A | 6/1993 | Adan | |
| 5,233,217 A | 8/1993 | Dixit | |
| 5,284,799 A | 2/1994 | Sato | |
| 6,107,200 A | 8/2000 | Takagi | |
| 6,258,707 B1 * | 7/2001 | Uzoh | ............................ 438/618 |

(Continued)

FOREIGN PATENT DOCUMENTS

| | | |
|---|---|---|
| CN | 1713396 A | 12/2005 |
| TW | 366581 | 8/1999 |
| TW | I292190 | 1/2008 |

OTHER PUBLICATIONS

Kobayashi et al., In situ infrared reflection and transmission absorption spectroscopy study of surface reactions in selective chemical-vapor deposition of tungsten using WF6 and SiH4, Jan. 6, 1993.

*Primary Examiner* — Kevin Parendo
(74) *Attorney, Agent, or Firm* — Winston Hsu; Scott Margo

(57) ABSTRACT

A manufacturing method for a buried circuit structure includes providing a substrate having at least a trench formed therein, forming a firs conductive layer on the substrate blanketly, forming a patterned photoresist having a surface lower than an opening of the trench in the trench, removing the first conductive layer not covered by the patterned photoresist to form a second conductive layer having a top lower than an opening of the trench in the trench, removing the patterned photoresist, performing a dry etching process to remove the second conductive layer from the bottom of the trench to form a third conductive layer on the sidewalls of the trench, performing a selective metal chemical vapor deposition to form a metal layer having a surface lower than a surface of the substrate, and forming a protecting layer filling the trench on the metal layer.

15 Claims, 14 Drawing Sheets

U.S. PATENT DOCUMENTS

| | | |
|---|---|---|
| 2002/0045332 A1 | 4/2002 | Jang |
| 2004/0209433 A1 | 10/2004 | Babcock |
| 2005/0285175 A1 | 12/2005 | Cheng et al. |
| 2007/0241338 A1* | 10/2007 | Yamamoto et al. ............. 257/77 |
| 2008/0150035 A1 | 6/2008 | Taguwa |
| 2011/0101435 A1* | 5/2011 | Jung et al. .................... 257/301 |

* cited by examiner

MANUFACTURING METHOD FOR A BURIED CIRCUIT STRUCTURE

CROSS REFERENCE TO RELATED APPLICATIONS

This is a continuation application of U.S. patent application Ser. No. 12/980,349, filed on Dec. 29, 2010, and all benefits of such earlier application are hereby claimed for this new continuation application.

BACKGROUND OF THE INVENTION

1. Field of the Invention

The invention relates to a manufacturing method for a buried circuit structure, and more particularly, to a manufacturing method for a buried circuit structure applied with a selective metal chemical vapor deposition (MCVD).

2. Description of the Prior Art

Along with miniaturization and complexity of integrated circuit (IC), the prior art has always devoted itself to scale down the device size for fabricating enough devices and constructing efficient circuit within a limited chip surface. Therefore approaches such as buried bit lines, buried word lines, or multilevel-interconnect structures are developed to create and realize three-dimension IC architectures.

Please refer to FIGS. 1-3, which are cross-sectional views illustrating a conventional manufacturing method for buried bit lines. The prior art first provides a substrate 100 having devices (not shown) formed therein. Then, a plurality of trenches 104 is formed in the substrate 100 and followed by forming a contact window (not shown) in each trench 104. A first metal layer 108 serving as a buried bit line is subsequently formed in the trench 104. Then, the trenches 104 are filled by an insulating layer and followed by forming a patterned hard mask 102 on the substrate 100. The pattern hard mask 102 is formed to define a plurality of trenches 106 having an extension direction perpendicular to an extension direction of the trenches 104. After forming the trenches 106, an insulating layer 110 is formed to cover the first metal layer 108 exposed in a bottom of the trenches 106, and followed by forming a second metal layer 112 such as a tungsten layer in the trenches 106. Subsequently, a silicon oxide layer 114 is formed in the trenches 106 and on the substrate 100. As shown in FIG. 1, the silicon oxide layer 114 covers the second metal layer 112.

Please refer to FIG. 2 and FIG. 3. After forming the silicon oxide layer 114, an etching back process is performed to remove a portion of the silicon oxide layer 114 in the trenches 106 to form a silicon oxide spacer on sidewalls of each trench 106. The silicon oxide spacer 116 covers at least a portion of the second metal layer 112 for defining a position and thickness of the buried bit line formed afterwards. After forming the silicon oxide spacers 116, an etching process is performed to remove the second metal layer 112 not covered by the silicon oxide spacers 116, and thus a metal layer 118 is obtained on two opposite sidewalls of the trenches 106, respectively. The metal layer 118 serves as a buried bit line, respectively. Thereafter, a protecting layer (not shown) is formed in the trenches 106 for filling the trenches 106 and the fabrications of the buried word lines and the buried bit lines are accomplished.

Please still refer to FIG. 2. It is noteworthy that the second metal layer 112 is a layer having a substantial thickness; therefore it is difficult to perform the etching process to remove the second metal layer 112 precisely. In the case that the second metal layer 112 is not etched completely, the final metal layers 118 as shown in FIG. 3 may contact each other at the bottom of the trench 106. Accordingly, buried bit line short circuit is occurred. On the contrary, in the case that the second metal layer 112 is over-etched, the final metal layers 118 as shown in FIG. 3 are undesirably and excessively thinned down. Accordingly, resistance is increased and thus performance of the IC is deteriorated.

Therefore, the approach that utilizing the silicon oxide spacer 116 define the position and the thickness of the buried bit lines have suffered some disadvantages of complicating process and difficulty with the process control. Thus, a simplified and economized manufacturing method for a buried circuit structure that is able to precisely form the buried circuit structure in the predetermined position is still in need.

SUMMARY OF THE INVENTION

According to an aspect of the present invention, there is provided a manufacturing method for a buried circuit structure. The manufacturing method includes providing a substrate having at least a trench formed therein, blanketly forming a first conductive layer on the substrate, forming a patterned photoresist having a surface lower than an opening of the trench in the trench, removing the first conductive layer not covered by the patterned photoresist to form a second conductive layer having a top lower than an opening of the trench in the trench, removing the patterned photoresist, performing a dry etching process to remove the second conductive layer from the bottom of the trench to form a third conductive layer on the sidewalls of the trench, performing a selective metal chemical vapor deposition (MCVD) to form a metal layer having a surface lower than a surface of the substrate, and forming a protecting layer filling the trench on the metal layer.

According to the manufacturing method for a buried circuit structure provided by the present invention, the selective MCVD is utilized to form the metal layer on specific materials but not on the insulating materials. Therefore the etching processes used to form the buried circuit structure in the prior art are eliminated from the manufacturing method. Accordingly, the process control and cost issues accompanied with the etching processes are fundamentally eliminated.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 9-14 are drawings illustrating a manufacturing method for a buried circuit structure according to a second preferred embodiment provided by the present invention; wherein FIG. 9 is a schematic top view of a buried circuit structure, FIGS. 10-14 are cross-sectional views taken along A-A' line of FIG. 9, and FIG. 12 is a drawing illustrating a modification to the second preferred embodiment.

DETAILED DESCRIPTION

Figure 1:
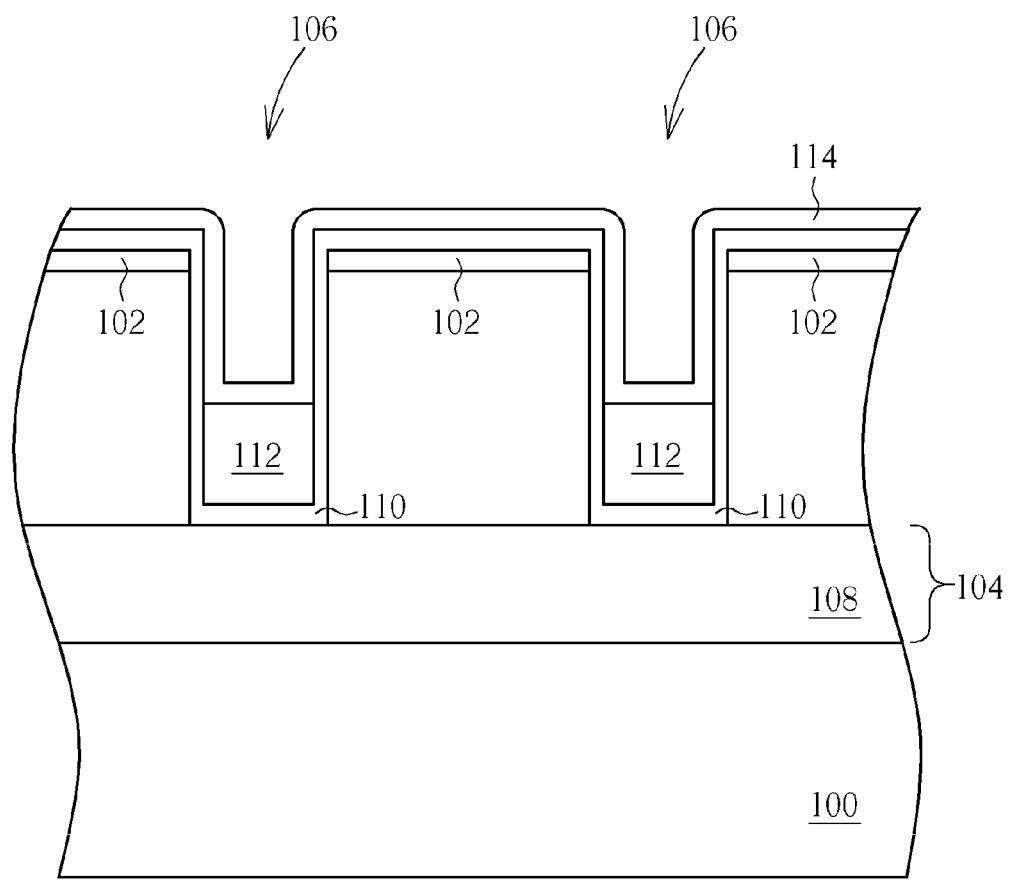
FIGS. 1-3 are cross-sectional views illustrating a conventional manufacturing method for a buried bit line.
Figure 2:
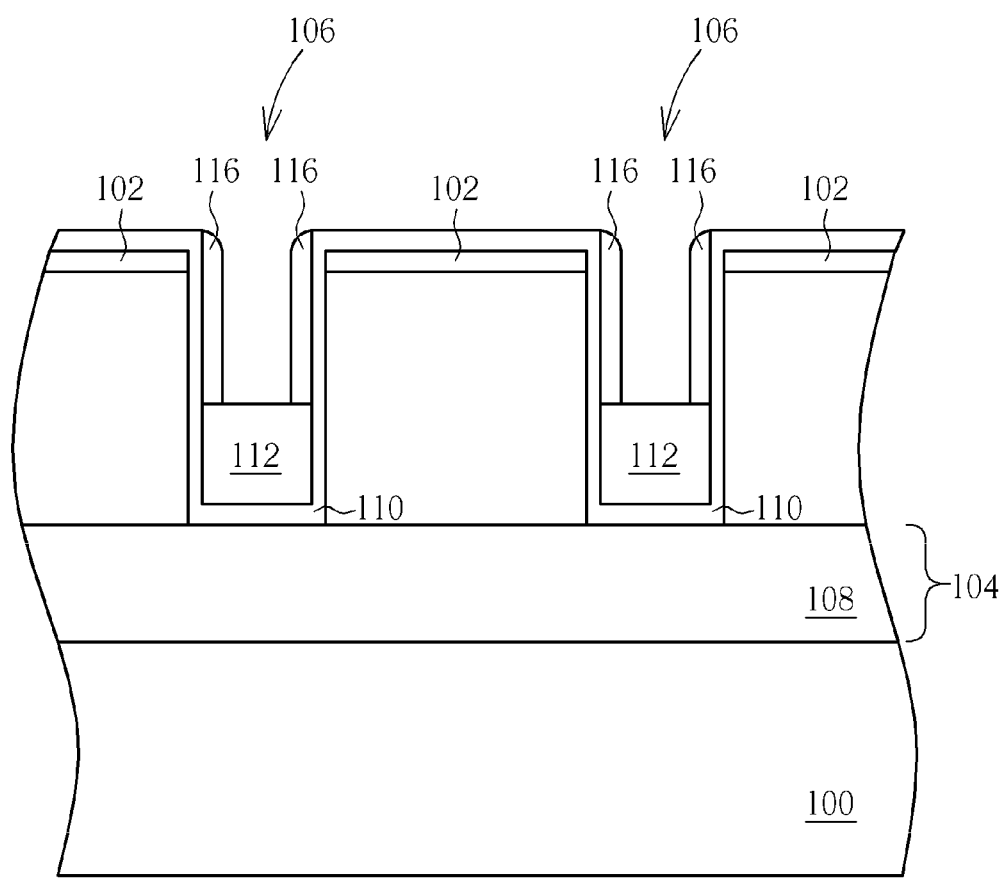
Figure 3:
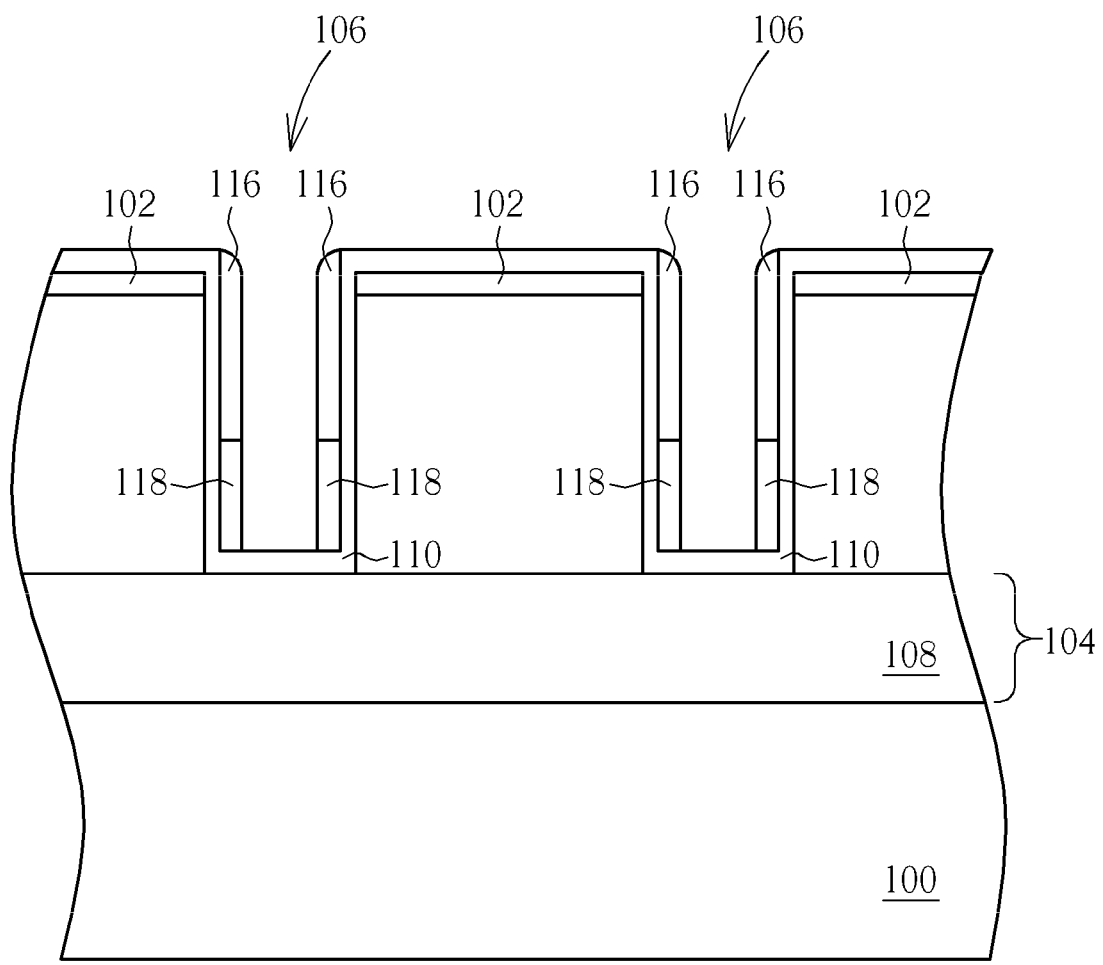
Figure 4:
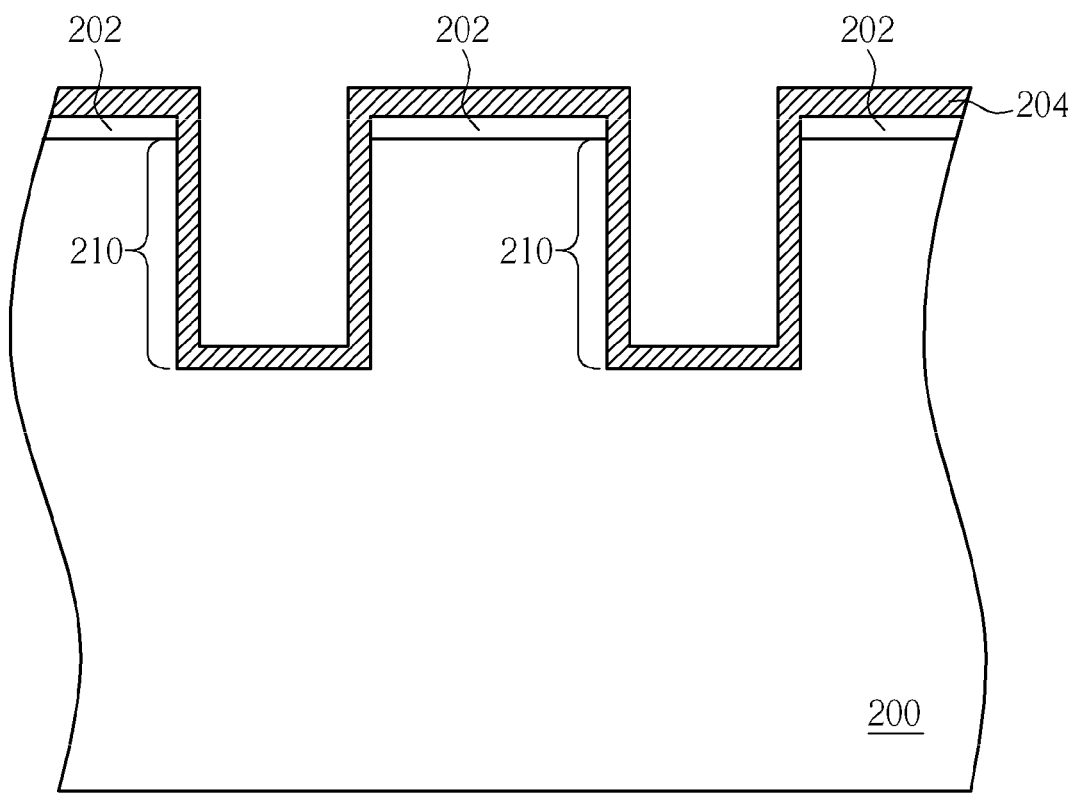
FIGS. 4-8 are drawings illustrating a manufacturing method for a buried circuit structure according to a first preferred embodiment provided by the present invention.

Please refer to FIGS. 4-8, which are drawings illustrating a manufacturing method for a buried circuit structure according to a first preferred embodiment provided by the present invention. As shown FIG. 4, the preferred embodiment first provides a substrate 200 such as a silicon substrate having at least a semiconductor device (not shown) formed therein. Then, a patterned first hard mask 202 is formed on the substrate 200. The patterned first hard mask 202 includes insulating materials selected from the group consisting of silicon oxide, plasma enhanced oxide (PEOX), silicon nitride, silicon oxynitride, silicon carbide, and combination of these materials. Additionally, the patterned first hard mask 202 can be a single-layered or a multi-layered structure. Next, an etching process is performed to the substrate 200 through the patterned first hard mask 202. Consequently, first trenches 210 as shown in FIG. 4 are obtained. Subsequently, a second hard mask 204 covering sidewalls and bottoms of the first trenches 210 and the patterned first hard mask 202 is formed on the substrate 200. The second hard mask 204 includes insulating materials selected from the group consisting of silicon oxide, PEOX, silicon nitride, silicon oxynitride, silicon carbide, and combination of these materials. Additionally, the second hard mask 204 can be a single-layered and a multi-layered structure.

Figure 5:
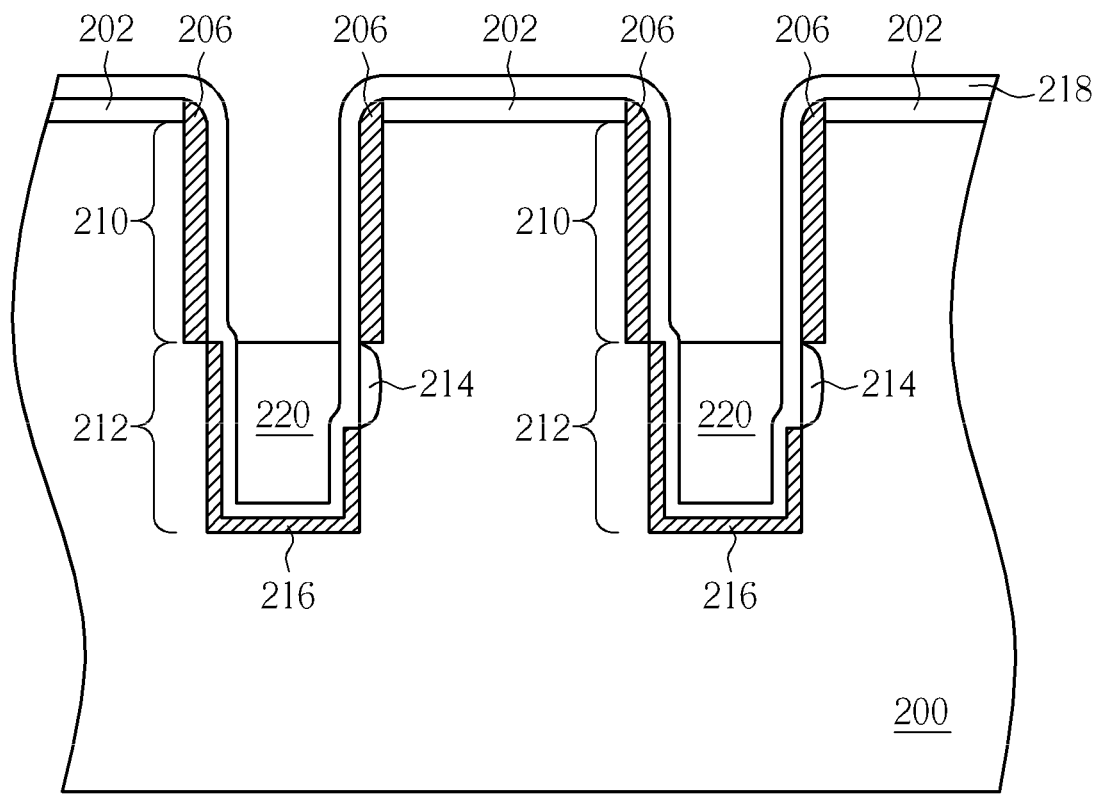

Please refer to FIG. 5. Then, a portion of the second hard mask 204 is removed from the bottoms of the first trenches 210. Consequently, a hard mask spacer 206 is formed on the sidewalls of the first trenches 210. Next, an etching process is performed with the patterned first hard mask 202 and the hard mask spacer 206 serving as an etching mask. The etching process is performed to etch the substrate 200 in the bottom of each first trench 210 to a predetermined depth. Accordingly, a second trench 212 downwardly extending from the bottom of each first trench 210 is respectively formed. After forming the second trenches 212, a dielectric layer 216 is formed on sidewalls and bottoms of the second trenches 212 by performing a thermal oxidation process, exemplarily.

Please still refer to FIG. 5. Then, a portion of the dielectric layer 216 is removed from the second trench 212. Subsequently, a contact window 214 is selectively formed on one of the sidewalls of each second trench 212. The contact window 214 is formed to provide electrical connection between the semiconductor device in the substrate 200 and the buried circuit structure formed afterwards. After forming the contact window 214, a conductive layer 218 covering the dielectric layer 216 and the contact window 214 is formed in the first trenches 210 and the second trenches 212. In the preferred embodiment, the conductive layer 218 includes titanium nitride (TiN), but not limited to this. After forming the conductive layer 218, a patterned photoresist 220 is formed in the second trenches 212. As shown in FIG. 5, the patterned photoresist 220 covers the conductive layer 218 on the bottoms and the sidewalls of the second trenches 212. Additionally, the top of the patterned photoresist 220 is preferably higher than the contact window 214.

Figure 6:
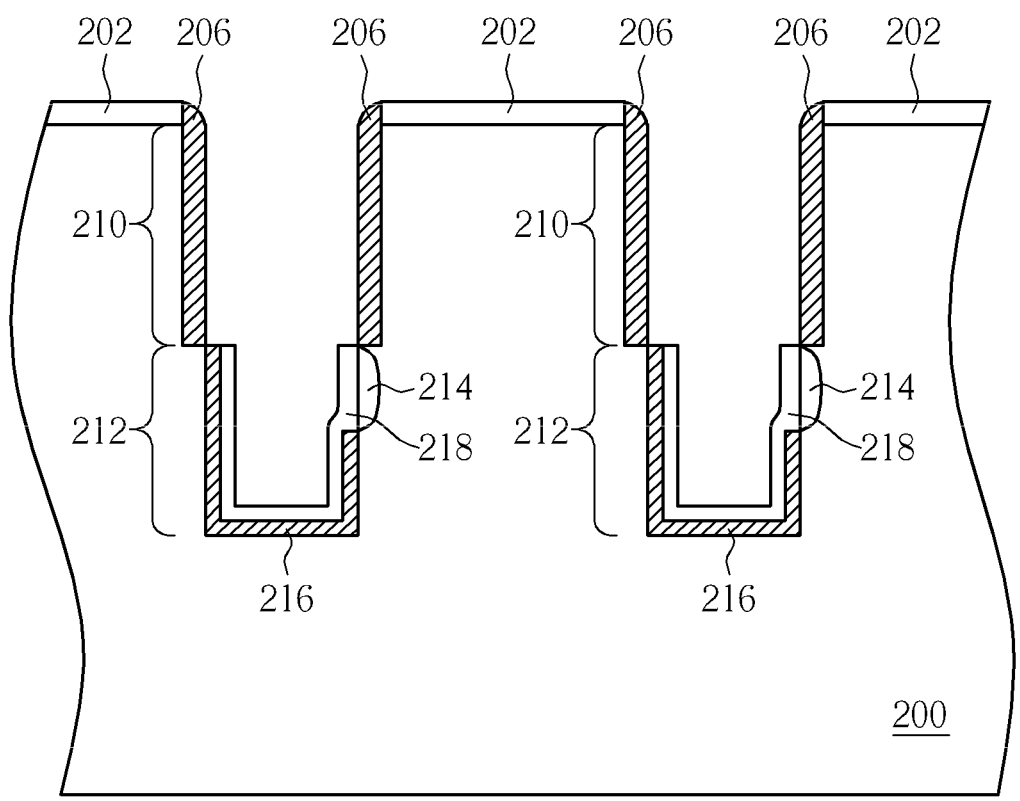

Please refer to FIG. 5 and FIG. 6. Next, an etching process is performed to remove the conductive layer 218 not covered by the patterned photoresist 220. Then, the patterned photoresist 220 is removed. Consequently, the remained conductive layer 218 has a top lower than an opening of the first trench 210 as shown in FIG. 6. In other words, the conductive layer 218 is remained only in the second trench 212 and covers the contact window 214.

Figure 7:
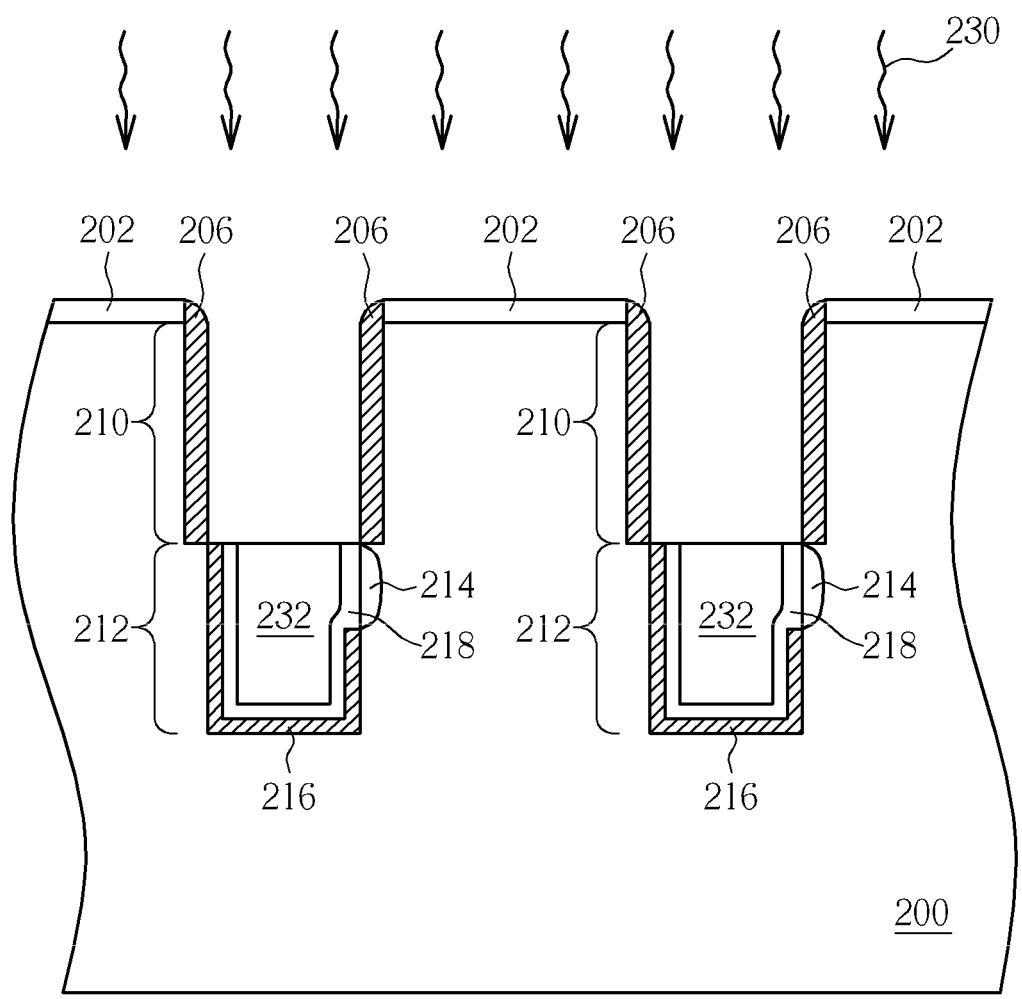

Please refer to FIG. 7. Subsequently, a selective metal chemical vapor deposition (MCVD) process is performed to the substrate 200. According to the preferred embodiment, the selective MCVD process includes a selective tungsten chemical vapor deposition (W-CVD) 230. The selective W-CVD 230 includes a process temperature of 20° C. to 300° C. and a process pressure of 30 Pa to 50 Pa. The selective W-CVD 230 further includes introducing tungsten hexafluoride ($WF_6$), silicon hydride ($SiH_4$), and nitrogen ($N_2$). According to the preferred embodiment, a gas flow rate of $WF_6$ is between 45 standard cubic centimeter per minute (sccm) and 50 sccm, a gas flow rate of $SiH_4$ is between 20 sccm and 25 sccm, and a gas flow rate of $N_2$ is between 340 sccm and 425 sccm.

It is well-known to those skilled in the art that tungsten can be deposited on some specific materials such as silicon, aluminum, titanium nitride, metal materials or conductive materials. According to the selective W-CVD 230 provided by the preferred embodiment, reduction of $WF_6$ is occurred at the conductive layer 218 including abovementioned materials such as TiN formed on the sidewalls and the bottoms of the second trenches 212. In other words, TiN reduces $WF_6$, thus a tungsten (W) layer is formed (not shown) on the sidewalls and the bottoms of the second trenches 212. Due to a self-limiting growth characteristic of the W layer, the W layer formed by the reduction of $WF_6$ stops growing as soon as the W layer entirely covers the sidewalls and the bottoms of the second trenches 212. Then, $SiH_4$, which is simultaneously introduced with $WF_6$, is dissociated to $SiH_x$ and H, and the quantity of X is from 1-3. Both $SiH_x$ and H adsorb on a surface of the conductive layer, namely on a surface of the W layer. $SiH_x$ and H subsequently react with $WF_6$ and thus W and $SiHF_3$ are formed. Accordingly, W is obtained by the reaction between $SiH_x$ and $WF_6$, and thus is deposited to form a W layer 232. It is noteworthy that no reduction is occurred between $WF_6$ and the insulating materials or the dielectric materials while no dissociation of $SiH_4$ is occurred on surfaces of the insulating materials or the dielectric materials, either. Therefore, there is no W layer 232 formed on areas covered by the insulating or dielectric materials. In the preferred embodiment, a surface of the substrate 200 is covered by the patterned first hard mask 202 and the sidewalls of the first trenches 210 are covered by the hard mask spacer 206, therefore silicon materials in the substrate 200 and the first trenches 210 are not allowed to be involved in the abovementioned reactions, and thus no W layer 232 is formed on the abovementioned surfaces. On the contrary, only the conductive layer 218 in the sidewalls and the bottoms of the second trenches 212 are allowed to be involved in the abovementioned reactions, therefore positions where the W layer 232 is preferably and desirably formed is ensured. In other words, a position or a height of the conductive layer 218 decides the position for forming the W layer 232. Accordingly, the W layer 232 provided by the preferred embodiment is formed to have a top lower than the opening of the first trench 210, which is lower than the surface of the substrate 200 as shown in FIG. 7.

Figure 8:
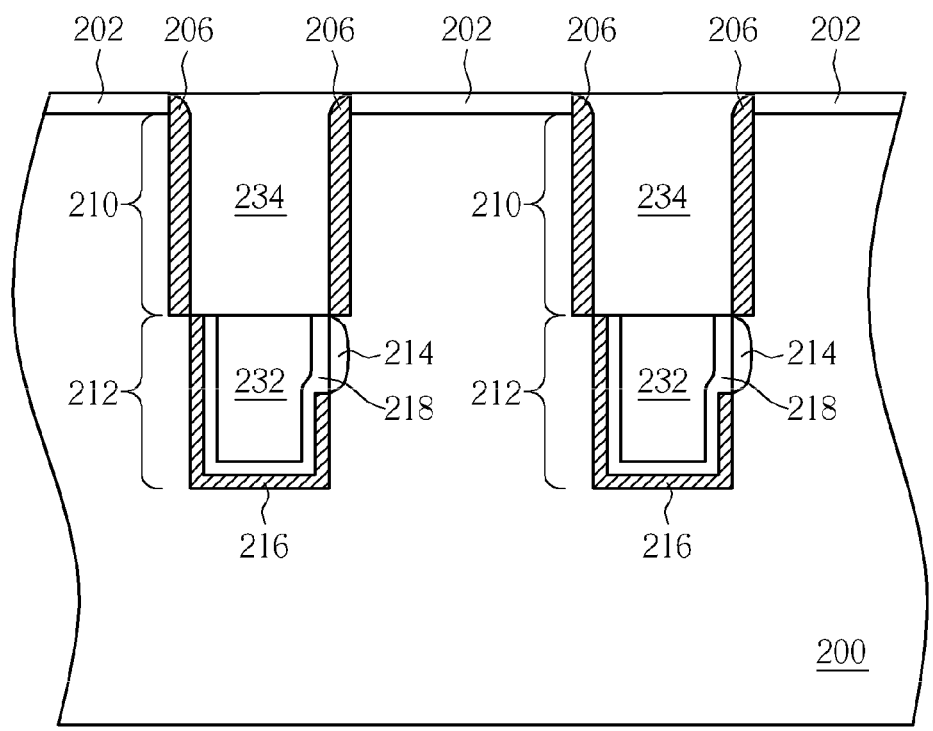

Please refer to FIG. 8. Thereafter, a protecting layer 234 exemplarily including silicon oxide, silicon nitride or silicon oxynitride is formed to fill the first trenches 210 on the W layer 232. And at least a buried bit line is obtained. Because the preferred embodiment is applied with the selective MCVD, no W layer 232 is formed on the surface of the substrate 200 that is covered by the patterned first hard mask 202 and on the sidewalls of the first trenches 210 that is covered by the hard mask spacer 206. Furthermore, the formation the conductive layer 218 ensures that the W layer 232 is formed on the predetermined and desirable positions, which is precisely aligned with contact window 214, and thus electrical connection is constructed. Additionally, since the CMP process or etching processes for forming the buried bit line required by the prior art are no longer in need. The micro-loading effect, which causes different etching results between high and low density patterns and the difficult process control to the etching processes are all prevented.

Figure 9:
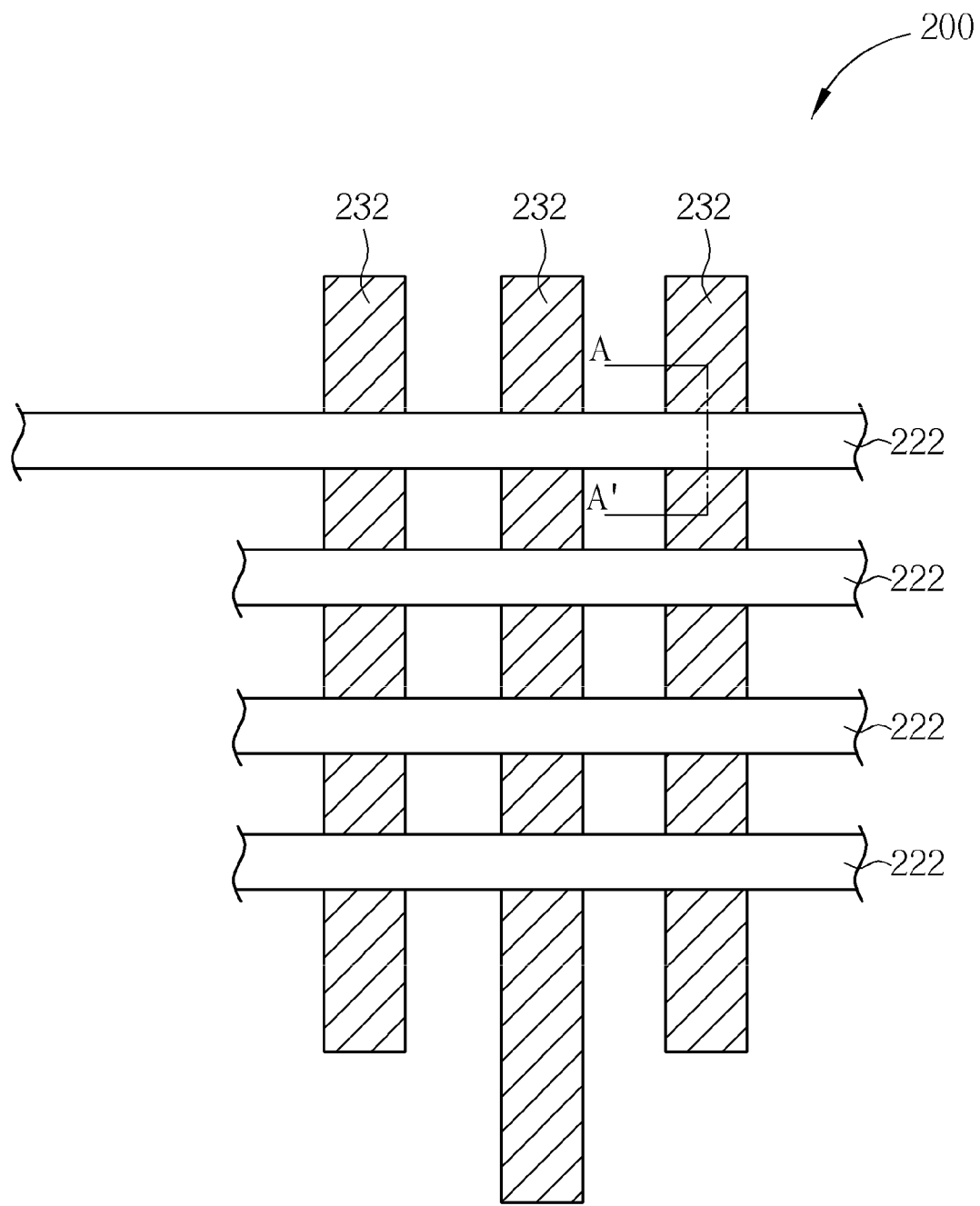

Please refer to FIGS. 9-14, which are drawings illustrating a manufacturing method for a buried circuit structure according to a second preferred embodiment provided by the present invention, wherein FIG. 9 is a schematic top view of a buried circuit structure and FIGS. 10-14 are cross-sectional views taken along A-A' line of FIG. 9. It is noteworthy that in the second preferred embodiment, the steps for forming the buried bit lines are the same with the steps described in the first preferred embodiment and shown in FIGS. 4-8, therefore those identical elements are designated by the same numerals and the details are omitted herein in the interest of brevity.

Please refer to FIG. 9. Those skilled in the art would easily realize that the word lines and the bit lines are structures perpendicular to each other as shown in FIG. 9. Therefore, after forming the W layer 232 (the buried bit line) in the second trenches 212 and filling the first trenches 210 with the protecting layer 234, a photo-etching-process is performed to form a plurality of third trenches 222 in the substrate 200. It is noteworthy that an extension direction of the third trench 222 is perpendicular to an extension direction of the buried bit line 232 as shown in FIG. 9.

Figure 10:
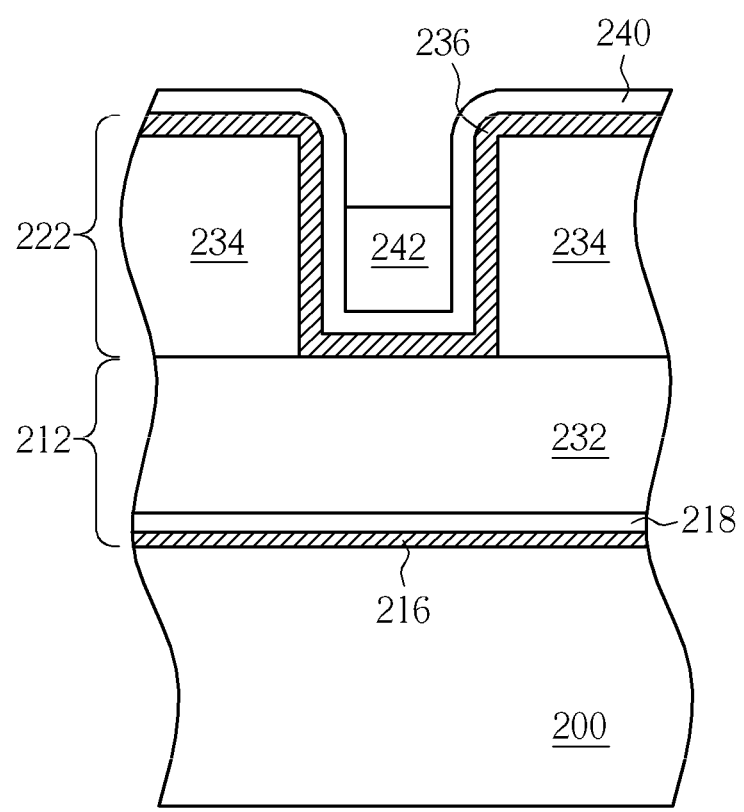

Please refer to FIG. 10. Since the W layer 232 is exposed in a bottom of the third trench 222, a protecting layer 236 not completely filling the third trench 222 is formed to cover sidewalls and bottom of the third trench 222. The protecting layer 236 used to provide electric isolation between the buried bit line 232 and the buried word line formed afterwards can include silicon oxide, silicon nitride or silicon oxynitride. Next, a conductive layer 240 such as a doped polysilicon layer or a TiN layer is formed on the substrate 200 blanketly. As shown in FIG. 10, the conductive layer 240 is formed in the third trench 222 and covers the sidewalls and the bottom of the third trench 222. After forming the conductive layer 240, a patterned photoresist 242 is formed in the third trench 222. It is noteworthy that a surface of the patterned photoresist 242 is lower than an opening of the third trench 222.

Figure 11:
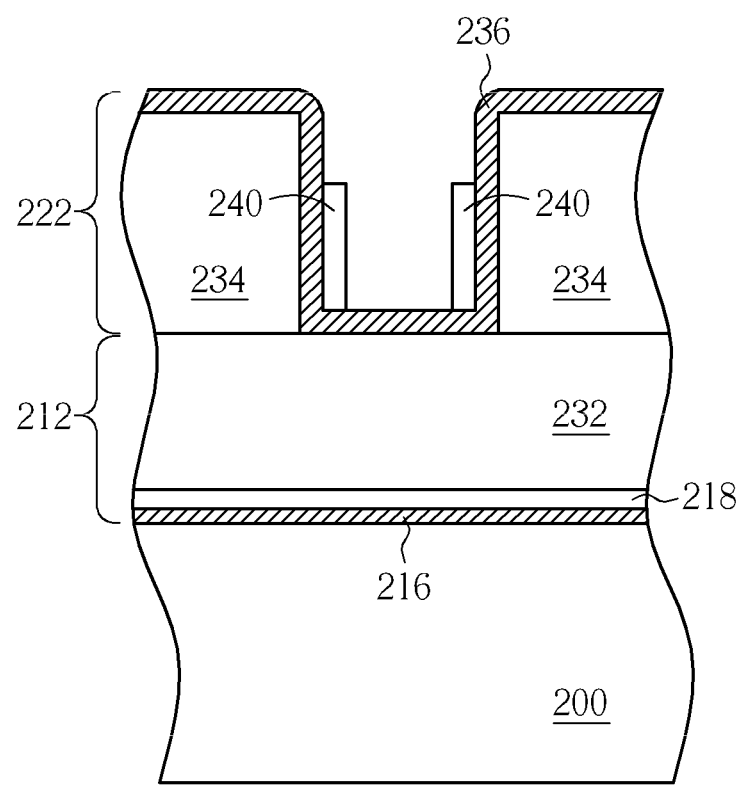

Please refer to FIG. 11. An etching process is subsequently performed to the conductive layer 240. Consequently, a portion of the conductive layer 240 not covered by the patterned photoresist 242 is removed. Then, the patterned photoresist 242 is removed and followed by performing a dry etching process to remove a portion of the conductive layer 240 from the bottom of the third trench 222. Accordingly, the conductive layer 240 having a top lower than the opening of the third trench 222 is remained only on the sidewalls of the third trench 222.

Figure 12:
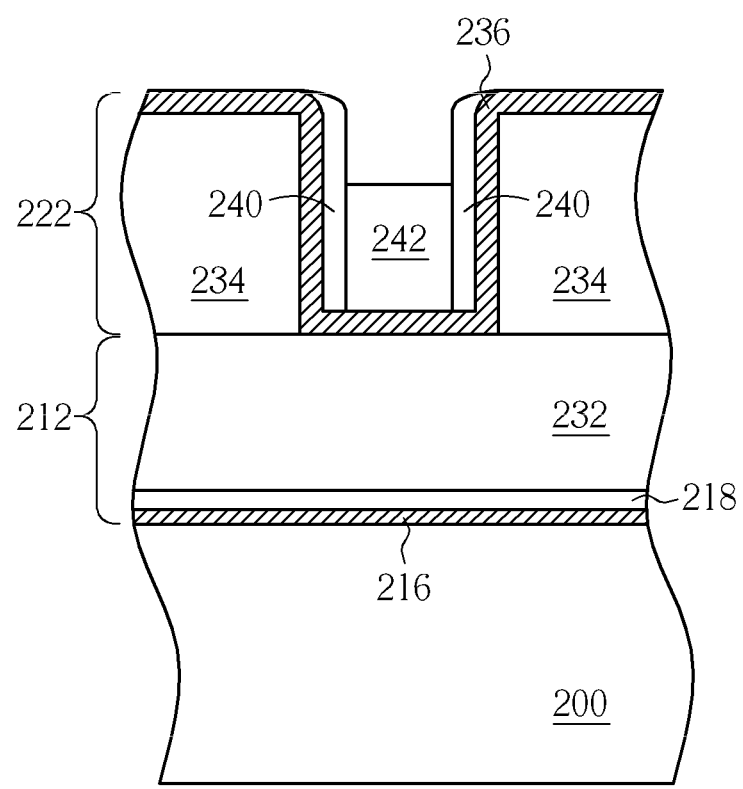

Please refer to FIG. 12, which is a drawing illustrating a modification to the preferred embodiment. As shown in FIG. 12, after forming the conductive layer 240, a dry etching process can be performed to remove a portion of the conductive layer 240 from the bottom of the third trench 222 and on the protecting layer 236. Consequently, the conductive layer 240 is remained only the sidewalls of the third trench 222. Thereafter, a patterned photoresist 242 having a surface lower than the opening of the third trench 222 is formed in the third trench 222. An etching process is subsequently performed to remove the conductive layer 240 not covered by the patterned photoresist 242. Thus the conductive layer 240 having a top lower than the opening of the third trench 222 is remained only on the sidewalls of the third trench 222 (shown in FIG. 11). And the patterned photoresist 242 is then removed.

Figure 13:
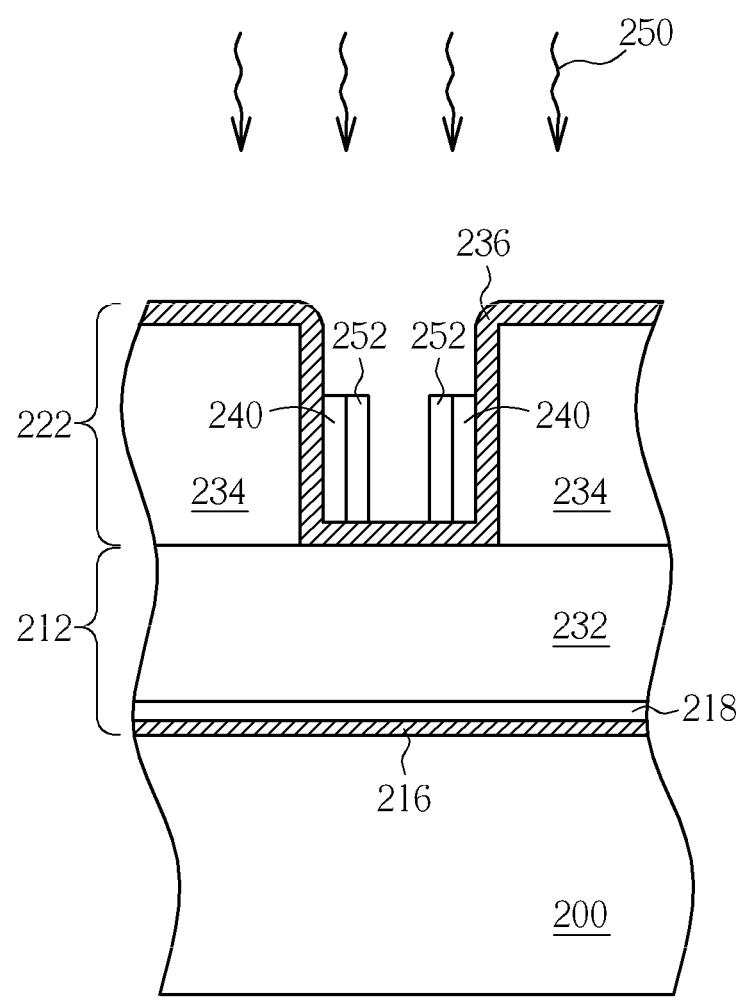

Please refer to FIG. 13. A selective MCVD is performed to the substrate 200. According to the preferred embodiment, the selective MCVD is preferably a selective W-CVD 250. A process temperature and a process pressure of the selective W-CVD 250 are the same with the selective W-CVD 230 disclosed in the first preferred embodiment; therefore the details are omitted for the sake of simplicity. As shown in FIG. 13, the selective W-CVD 250 is performed to form a W layer 252 on the conductive layer 240 in the third trench 222. As mentioned above, since the W layer 252 cannot be formed in the third trench 222 covered by the protecting layer 236, the W layer 252 is always formed at predetermined and desirable positions precisely. According to the preferred embodiment, a thickness of the W layer 252 is adjustable by adjusting the process duration of the selective W-CVD 250. Therefore the W layer 252 having predetermined and desirable thickness is obtained. The W layer 252 serves a buried word line/gate, the conductive layer 240 serves as a portion of the word line/gate, and the protecting layer 236 serves as a gate dielectric layer.

Figure 14:
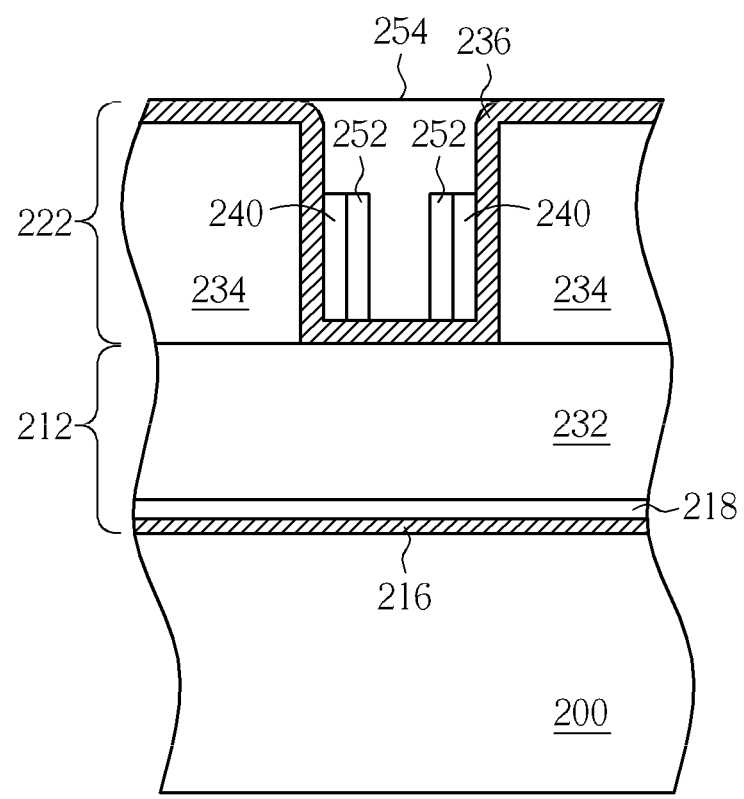

Please refer to FIG. 14. Thereafter, a protecting layer 254 is formed to fill the third trench 222 on the W layer 252, and thus a buried circuit structure is obtained. Because the preferred embodiment is applied with the selective metal CVD, no W layer 232/252 is formed on the surface of the substrate 200 and in the third trench 222 that is covered by the patterned first hard mask 202 and the protecting layer 236. Furthermore, the formation the conductive layer 218 in the second trench 212 and the conductive layer 240 in the third trench 252 ensure the W layer 232 and the W layer 252 are formed on the predetermined and desirable positions. In other words, the preferred embodiment is to form the buried bit lines 232 and the buried word lines 252 at the predetermined and desirable positions without etching the W layers.

According to the manufacturing method for buried circuit structure provided by the present invention, the selective CVD is utilized to form the metal layer on the specific materials but not on the insulating materials. Therefore the etching process and CMP processes used to form the buried circuit structure in the prior art are eliminated from the manufacturing method. Accordingly, the micro-loading effect usually occurred in the CMP process and the process control and cost issues accompanied with the etching processes are all fundamentally eliminated. Furthermore, by adjusting the process parameters and process duration of the selective MCVD, a height and thickness of the buried circuit structure is ensured.

In addition, though the present invention is disclosed with the buried bit lines and the buried word lines serving as the preferred embodiments, it should be conceivable that the present invention also is performed to form other buried circuit structures having three-dimension architecture such as the single or dual damascene interconnect structures. For example, after forming the trenches or vias required by the single or dual damascene interconnect structure, the conductive layer or a silicon layer is formed in the trench and/or via for providing the essential reaction of the selective MCVD. In addition, it is also conceivable to form the trenches or the vias directly in a silicon layer and forming the single or dual interconnect structure by performing the present invention. And the silicon layer can be subsequently removed to form a single or dual interconnect structure having air gap. Furthermore, the present invention can be used to form capacitor electrode of a trench capacitor or the through-silicon via.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method for a buried circuit structure comprising:
   providing a substrate having at least a trench formed therein;
   forming a first conductive layer on the substrate blanketly so that the first conductive layer covers a surface of the substrate, sidewalls of the trench, and a bottom of the trench;
   forming a patterned photoresist in the trench, the patterned photoresist having a top surface lower than an opening of the trench;
   removing the first conductive layer not covered by the patterned photoresist to form a second conductive layer having a top lower than an opening of the trench in the trench;
   removing the patterned photoresist;
   performing a dry etching process to remove the second conductive layer from the bottom of the trench to form a third conductive layer on the sidewalls of the trench;
   performing a selective metal chemical vapor deposition to form a metal layer having a top lower than the surface of the substrate; and
   forming a protecting layer filling the trench on the metal layer.

2. The manufacturing method for the buried circuit structure according to claim 1, wherein the trench is formed by a process that comprises:
   forming a patterned first hard mask on the substrate;
   performing a first etching process to etch the substrate to form at least a first trench in the substrate through the patterned first hard mask;
   forming a second hard mask covering sidewalls and a bottom of the first trench and the patterned first hard mask on the substrate;
   removing a portion of the second hard mask from the bottom of the first trench to form a hard mask spacer on the sidewalls of the first trench; and
   performing a second etching process to form a second trench in the bottom of the first trench.

3. The manufacturing method for the buried circuit structure according to claim 2, further comprising forming a dielectric layer exposing a portion of sidewalls of the second trench in the second trench before forming the first conductive layer.

4. The manufacturing method for the buried circuit structure according to claim 3, further comprising forming a contact window on one of the sidewalls of the second trench after forming the dielectric layer and before forming the first conductive layer.

5. The manufacturing method for the buried circuit structure according to claim 2, wherein the patterned first hard mask and the second hard mask comprise insulating materials.

6. The manufacturing method for the buried circuit structure according to claim 5, wherein the insulating materials are selected from the group consisting of silicon oxide, plasma enhanced oxide (PEOX), silicon nitride, silicon oxynitride, silicon carbide, and a combination of these materials.

7. The manufacturing method for the buried circuit structure according to claim 1, wherein the dry etching process is performed after removing the patterned photoresist.

8. The manufacturing method for the buried circuit structure according to claim 1, wherein the dry etching process is performed before forming the patterned photoresist.

9. The manufacturing method for the buried circuit structure according to claim 1, wherein the first conductive layer comprises a doped silicon layer or a titanium nitride layer.

10. The manufacturing method for the buried circuit structure according to claim 1, wherein the selective metal chemical vapor deposition comprises a selective tungsten chemical vapor deposition (W-CVD).

11. The manufacturing method for the buried circuit structure according to claim 10, wherein the W-CVD comprises a process temperature of 20° C. to 300° C.

12. The manufacturing method for the buried circuit structure according to claim 10, wherein the W-CVD comprises a process pressure of 30 Pa to 50 Pa.

13. The manufacturing method for the buried circuit structure according to claim 10, wherein the W-CVD further comprises tungsten hexafluoride ($WF_6$), silicon hydride ($SiH_4$), and nitrogen ($N_2$).

14. The manufacturing method for the buried circuit structure according to claim 12, wherein a gas flow rate of $WF_6$ is between 45 sccm and 50 standard cubic centimeter per minute (sccm), a gas flow rate of $SiH_4$ is between 20 sccm and 25 sccm, and a gas flow rate of $N_2$ is between 340 sccm and 425 sccm.

15. The manufacturing method for the buried circuit structure according to claim 1, wherein the protecting layer comprises silicon oxide, silicon nitride, or silicon oxynitride.

* * * * *